United States Patent
Sato

(10) Patent No.: US 6,507,533 B2
(45) Date of Patent: Jan. 14, 2003

(54) SEMICONDUCTOR MEMORY DEVICE HAVING A WORD LINE ACTIVATION BLOCK

(75) Inventor: Hiroyuki Sato, Kawasaki (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/828,410

(22) Filed: Apr. 6, 2001

(65) Prior Publication Data

US 2001/0028595 A1 Oct. 11, 2001

(30) Foreign Application Priority Data

Apr. 7, 2000 (JP) ........................................ 2000-106118

(51) Int. Cl.$^7$ ................................................ G11C 8/00
(52) U.S. Cl. ............................. 365/230.03; 365/230.06
(58) Field of Search ....................... 365/230.03, 230.06, 365/230.01

(56) References Cited

U.S. PATENT DOCUMENTS 5,808,955 A * 9/1998 Hwang et al. .............. 326/106
5,875,133 A * 2/1999 Miyashita et al. ..... 365/189.09
6,044,028 A * 3/2000 Tomohiro et al. .......... 365/200

* cited by examiner

*Primary Examiner*—Hoai Ho
(74) *Attorney, Agent, or Firm*—Hayes Soloway PC

(57) ABSTRACT

A DRAM has a plurality of memory cell arrays each including a plurality of memory cell blocks and a plurality of subword lines separately from the main word lines. The subword lines are specified by a word line activation block after the row address decoders specify one of the main word lines. The word line activation decoder block is disposed adjacent to the row address decoder block. Each of the word line activation lines has a first portion extending parallel to the main word lines and a second portion extending within the area for the subword drivers.

13 Claims, 10 Drawing Sheets

FIG. 2
PRIOR ART

SEMICONDUCTOR MEMORY DEVICE HAVING A WORD LINE ACTIVATION BLOCK

BACKGROUND OF THE INVENTION

(a) Field of the Invention

The present invention relates to a semiconductor memory device having a word line activation block, and more particularly to the arrangement of the word line activation block with respect to a row address decoder.

(b) Description of the Related Art

A DRAM is known which includes a plurality of memory cell arrays each having a plurality of subword lines separately from main word lines for specifying the row address of a selected memory cell in each memory cell array. The subword lines are generally activated by a higher voltage signal than the operational voltage.

FIG. 1 shows a conventional DRAM having such a configuration, wherein the DRAM has four memory cell arrays ARY1 to ARY4 and peripheral circuits such as logic circuits etc. FIG. 2 shows one of the memory cell arrays ARY1 to ARY4 shown in FIG. 1. The memory cell array, for example, memory cell array ARY1 includes a plurality of memory cell blocks MCA1 to MCA16 arranged in a matrix, a plurality of main address decoder blocks XDA1 to XDA4 each corresponding to one of the memory cell blocks MCA1 to MCA16, a plurality of subword driver sections SWD1 to SWD20 each two sandwiching therebetween a corresponding one of memory cell blocks MCA1 to MCA16, a plurality of sense amplifier blocks SAA1 to SAA20 each two sandwiching therebetween a corresponding one of the memory cell blocks MCA1 to MCA16, and a plurality of word line activation blocks WA1 to WA16.

The subword drivers SWD1 to SWD20 receive output signals from the row address decoder blocks XDA1 to XDA4, i.e., main word signals including the information of significant bits of the row address signal, and word line activation signals from the word line activation blocks YAD1–YAD4. The word line activation signal includes the information of less significant bits of the row address signal and a higher voltage level with respect to the main address signal. Each of the subword drivers SWD1 to SWD20 outputs a signal having the higher voltage level through one of the subword lines. For this purpose, the word line activation blocks WA1 to WA16 are arranged in the peripheral area adjacent to the column address decoders to activate the activation signal lines extending normal to the main word lines.

In the conventional DRAM as described above, it is difficult to find room for the activation signal lines for transferring output activation signals from the word line activation blocks WA1 to WA16 within the sense amplifier blocks SAA1 to SAA4. Thus, as shown in FIG. 3 depicting a part of the memory cell array of FIG. 2, the area for the memory cell block MCA1 is extended in the row direction to pass the activation signal lines WS1 to WS4 which by-pass the area for the sense amplifier blocks SAA1.

In addition, in a virtual channel DRAM which includes a data buffer array and a SRAM adjacent to the sense amplifiers, the area for the word line activation blocks WA1 to WA16 is generally occupied by the data buffer array. Thus, it is desired to relocate the word line activation blocks WA1 to WA16 into an area other than the area for the data buffer array in the virtual channel DRAM.

SUMMARY OF THE INVENTION

It is an object of the present invention to provide a semiconductor memory device which is capable of arranging the word line activation blocks and the activation signal lines at suitable locations.

The present invention provides a semiconductor memory device comprising:

a memory cell array including an array of memory cells arranged in a matrix, a plurality of subword lines each specifying a row of the memory cells, and a plurality of data lines for specifying a column of the memory cells;

a column address decoder block including a plurality of column address decoders each responding to a column address signal to specify a corresponding one of the data lines;

a row address decoder block including a plurality of row address decoders each for responding to significant bits of a row address signal to generate a main word signal;

a plurality of main word lines each disposed for a corresponding one of the address decoders for transferring the main word signal;

a word line activation block including a plurality of word line activation decoders each for responding to less-significant bits of the row address signal to generate a subword signal;

a plurality of word line activation lines each disposed for a corresponding one of the word line activation decoders to transfer the subword signal; and a subword driver block for responding to the main word signal and the subword signal to specify one of the subword lines, wherein the word line activation block is disposed adjacent to at least some of the row address decoders.

In accordance with the semiconductor memory device of the present invention, this arrangement of the word line activation blocks affords a wider design choice for the semiconductor memory device. Especially, in a virtual channel DRAM, data buffer arrays can be disposed adjacent to the sense amplifier block without interference with the word line activation block.

BRIEF DESCRIPTION OF THE DRAWINGS

Figure 2:
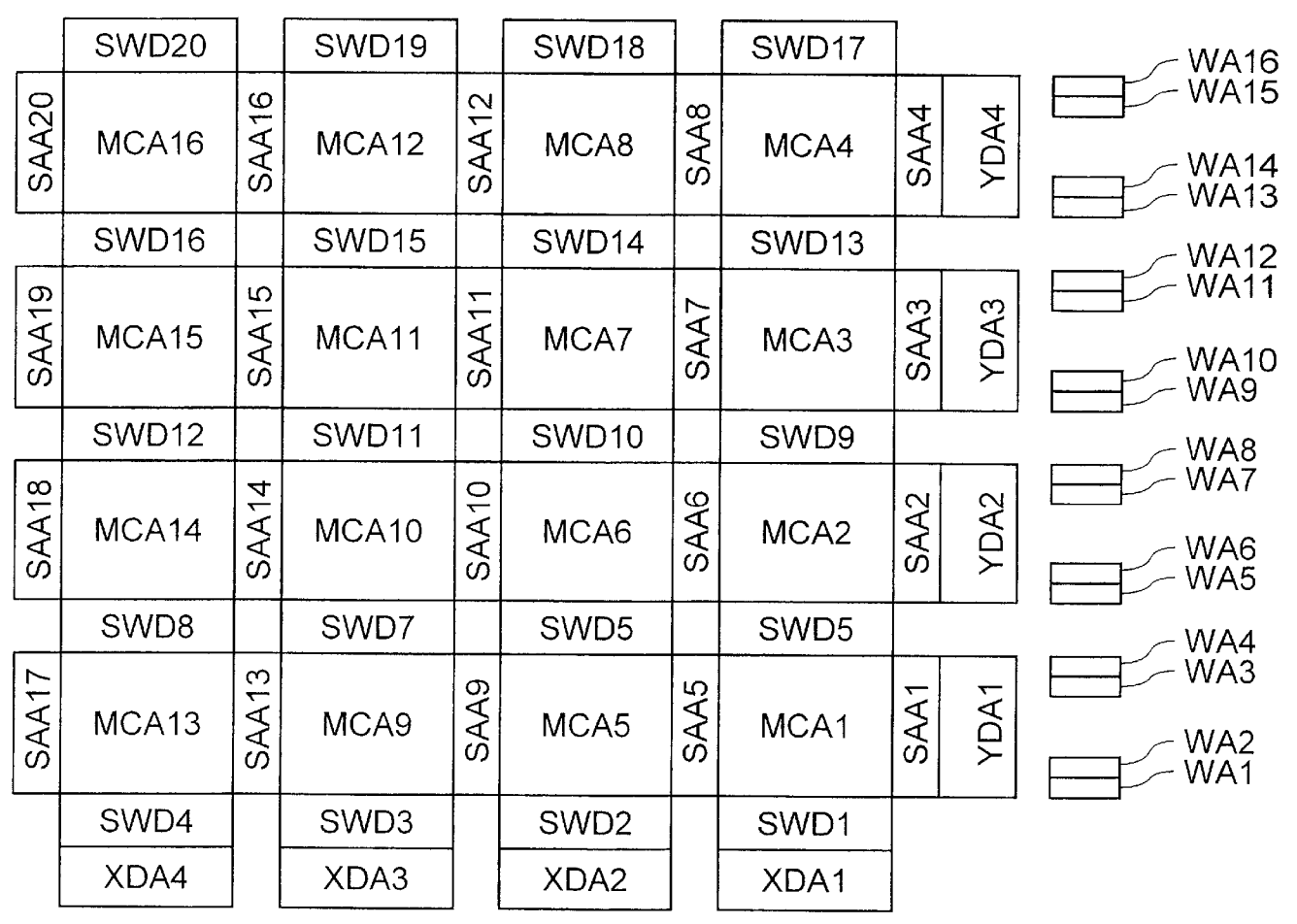

FIG. 2 is a top plan view of one of the memory cell arrays shown in FIG. 1.

DETAILED DESCRIPTION OF THE PREFERRED EMBODIMENTS

For the sake of clarity of the forgoing and other objects, features, and advantages of the present invention, embodiments of the present invention will be described hereinafter in detail with reference to the accompanying drawings.

Figure 1:
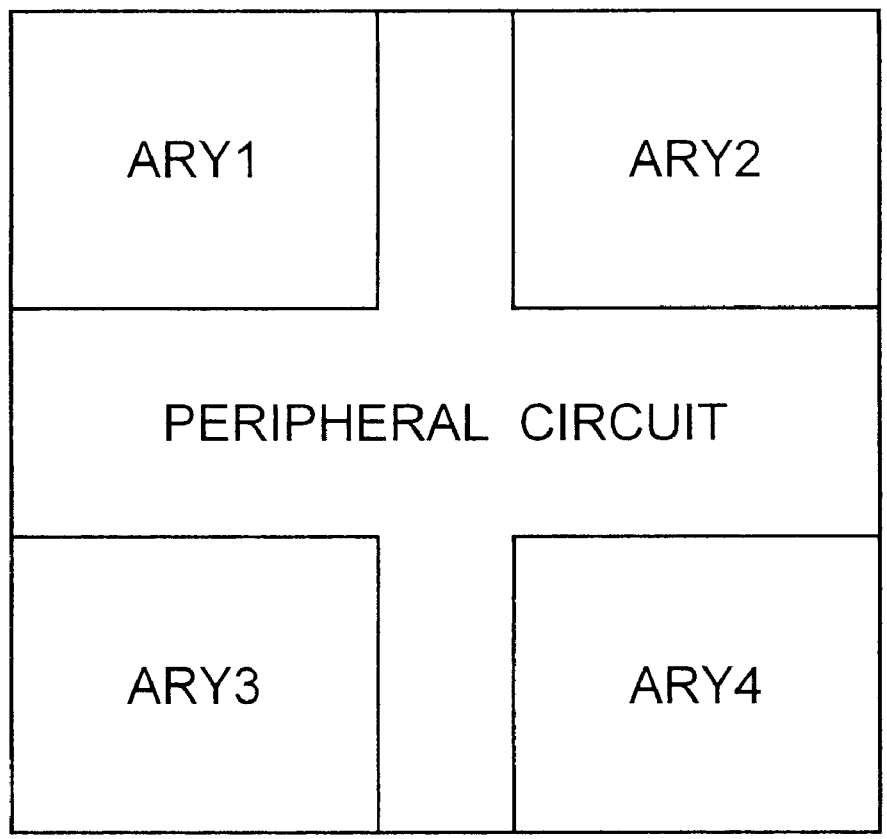
FIG. 1 is a top plan view of a conventional DRAM having a plurality of memory cell arrays.
Figure 3:
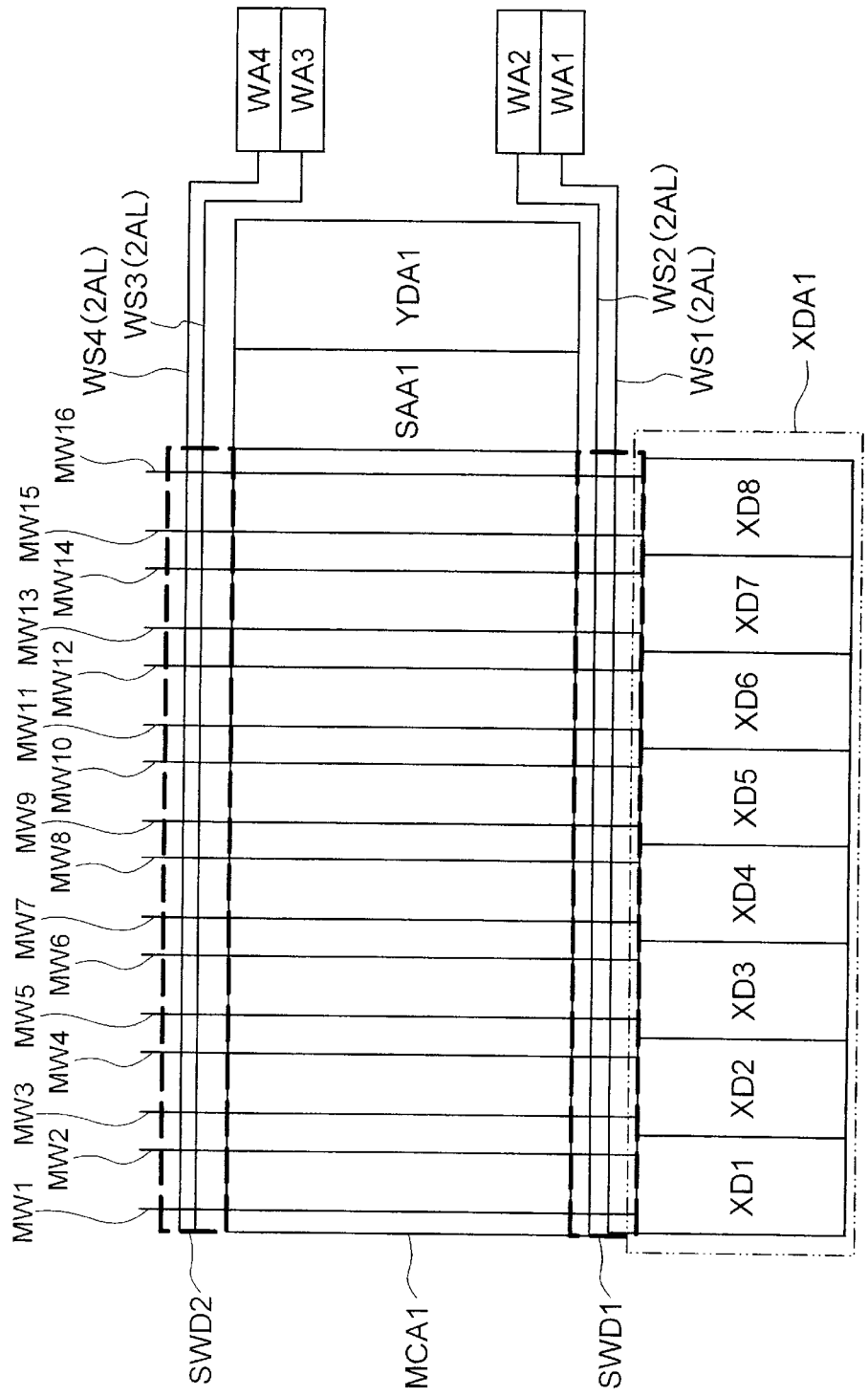
FIG. 3 is a top plan view of the exemplified arrangement of the activation signal lines in the conventional DRAM of FIG. 1.
Figure 4:
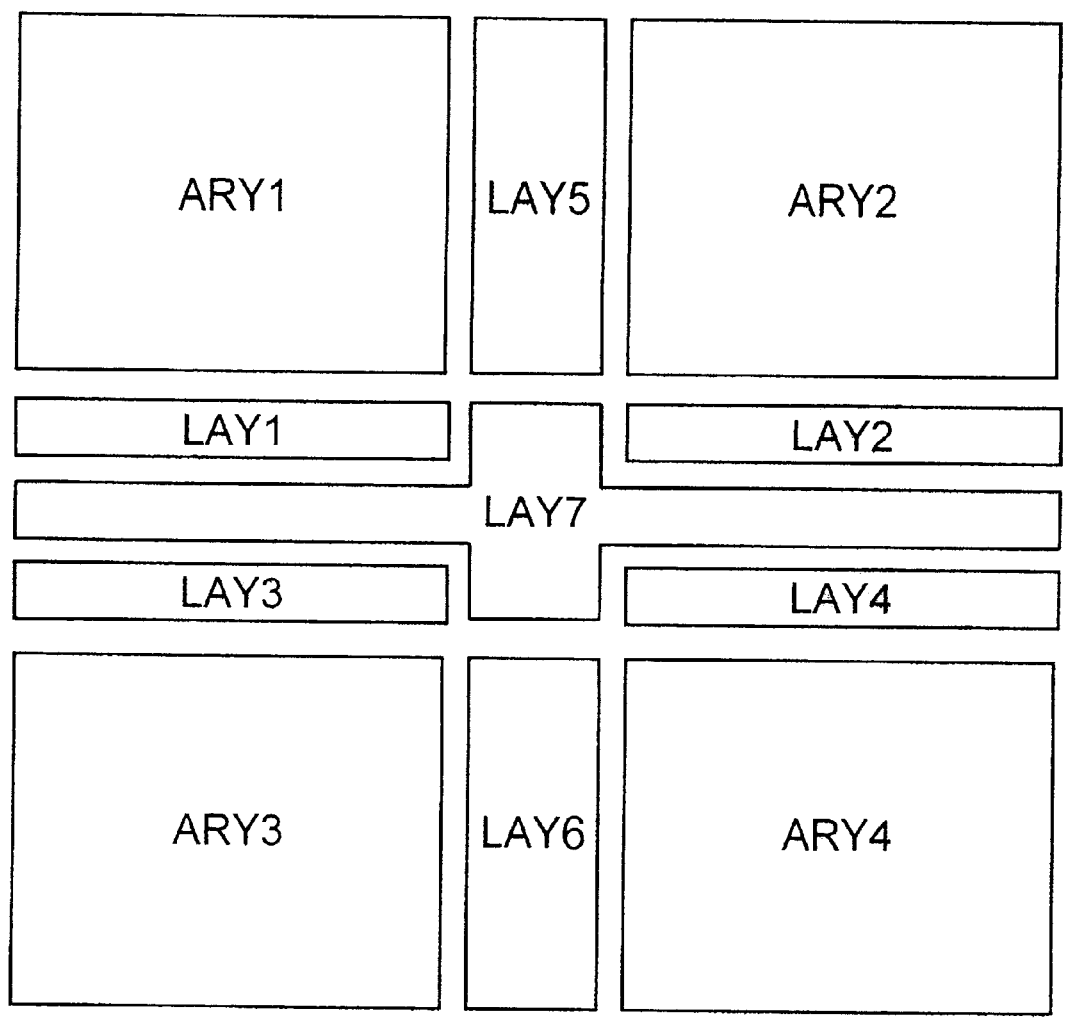
FIG. 4 is a top plan view of a DRAM shown as a semiconductor memory device according to an embodiment of the present invention.

Referring to FIG. 4, a DRAM shown as a semiconductor memory device according an embodiment of the present invention includes a plurality (four in this example) of memory cell arrays ARY1 to ARY4 arranged in a matrix, a plurality of peripheral circuits LAY1 to LAY4 disposed for the row address decoder blocks of the memory cell array, a plurality of peripheral circuits LAY5 and LAY6 disposed for the column address decoder blocks, and a peripheral circuit LAY7 such as logic circuit or bonding pads.

Figure 5:
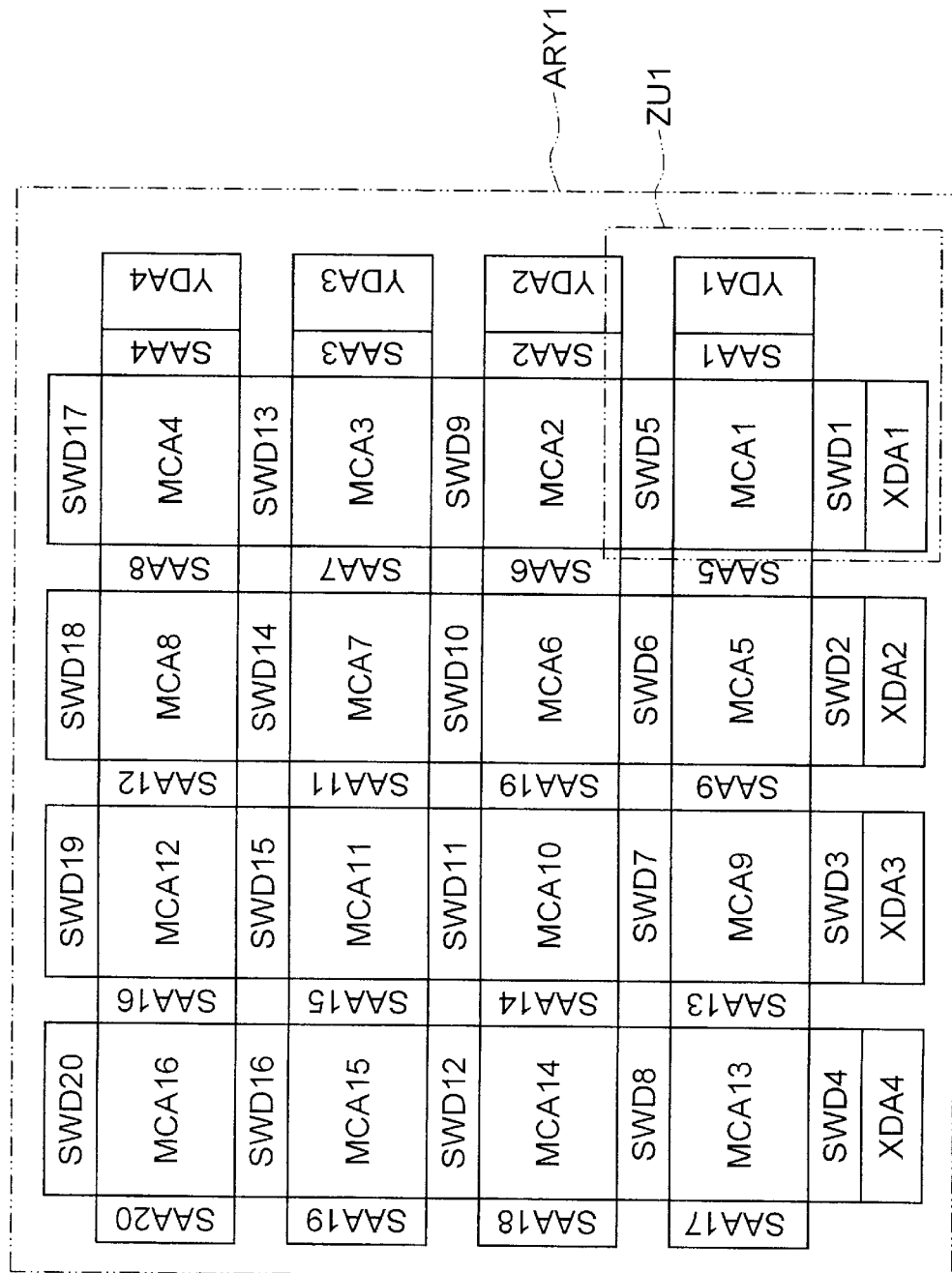
FIG. 5 is a top plan view of one of the memory cell arrays in the DRAM of FIG. 4.

Referring to FIG. 5, one of the memory cell arrays ARY1 to ARY4, i.e., ARY1 in this example, includes a plurality (4×4 in this case) of memory cell blocks MCA1 to MCA16 arranged in a matrix, a plurality of main address decoder blocks XDA1 to XDA4 each corresponding to a row of the memory cell blocks MCA1 to MCA16, a plurality of sub-word driver sections SWD1 to SWD20 each two sandwiching therebetween a corresponding one of the memory cell blocks MCA1 to MCA16, a plurality of sense amplifier blocks SAA1 to SAA20 each two sandwiching therebetween a corresponding one of the memory cell blocks MCA1 to MCA16, and a plurality of column address decoder blocks YDA1 to YDA4 each corresponding to a column of the memory cell blocks MCA1 to MCA16. In the DRAM of the present embodiment, the word line activation blocks (not shown) are disposed within the area for the row address decoder blocks XDA1 to XDA4 as detailed hereinafter.

Figure 6:
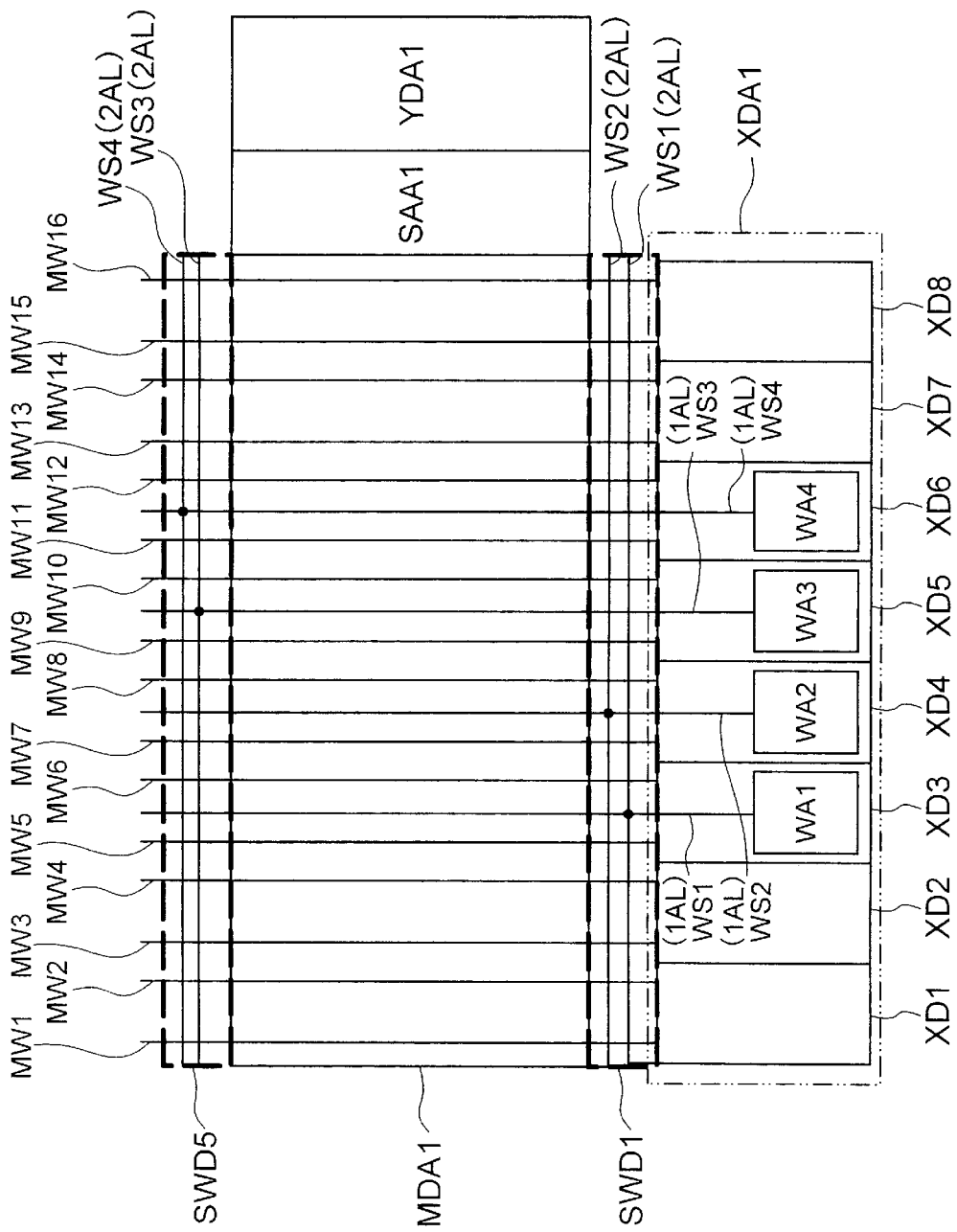
FIG. 6 is a top plan view of one of the memory cell blocks shown in FIG. 5.

Referring to FIG. 6 schematically showing the row address decoder block XDA1, the subword driver sections SWD1 and SWD5 and the memory cell block MCA1 in FIG. 5, the word line activation blocks WA1 to WA4 are disposed in the area for the row address decoder block XAD1. In FIG. 6, each address decoder XD1, XD2, . . . XD8 in the row address decoder block XAD1 outputs a pair of complementary signals on a corresponding pair of main word lines MW1, MW2, . . . MW16 extending in the row direction.

Among the subword driver sections SWD1, SWD5, SWD9, SWD13, SWD17 that receive main word signals delivered through the main word lines MW1 to MW16 from the row address decoder block XDA1, the subword driver sections SWD1, SWD9 and SWD17 receive the activation signals WS1 and WS2, whereas the subword driver sections SWD5 and SWD13 receive the activation signals WS3 and WS4.

Each of the activation lines WS1 to WS4 has a first portion extending from a corresponding one of the word line activation blocks WA1 to WA4 in a row direction, and a second portion extending in the column direction within the area for a corresponding one of the subword driver sections.

As described above, the subword driver sections receiving the main word signals output from the row address decoder block XDA1 require a total of four word line activation signal lines. Thus, four word line activation blocks WA1, WA2, WA3 and WA4 are arranged in the row address decoders XD3, XD4, XD5 and XD6, respectively.

Figure 7:
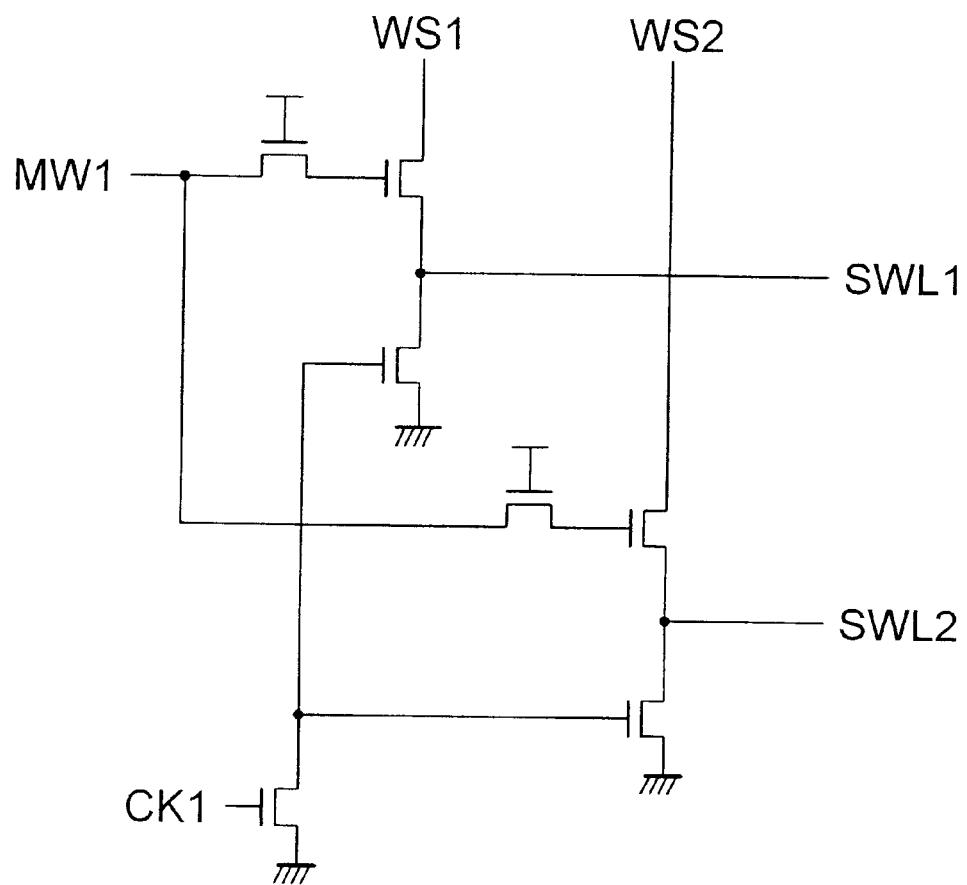
FIG. 7 is a circuit diagram of the subword driver in the DRAM of the embodiment.

Referring to FIG. 7, the subword driver, for example, subword driver SWD1 in the subword driver sections has a self-boot function wherein the main row address signal fed through the main word line MW1 is delivered to one of the subword lines SWL1 or SWL2 while raising the signal level to a higher voltage level. The main word signal is delivered to the subword lines SWL1 and SWL2 depending on the activation signals supplied through the activation signal lines WS1 and WS2, one of which is "1" and the other of which is "0".

Figure 8:
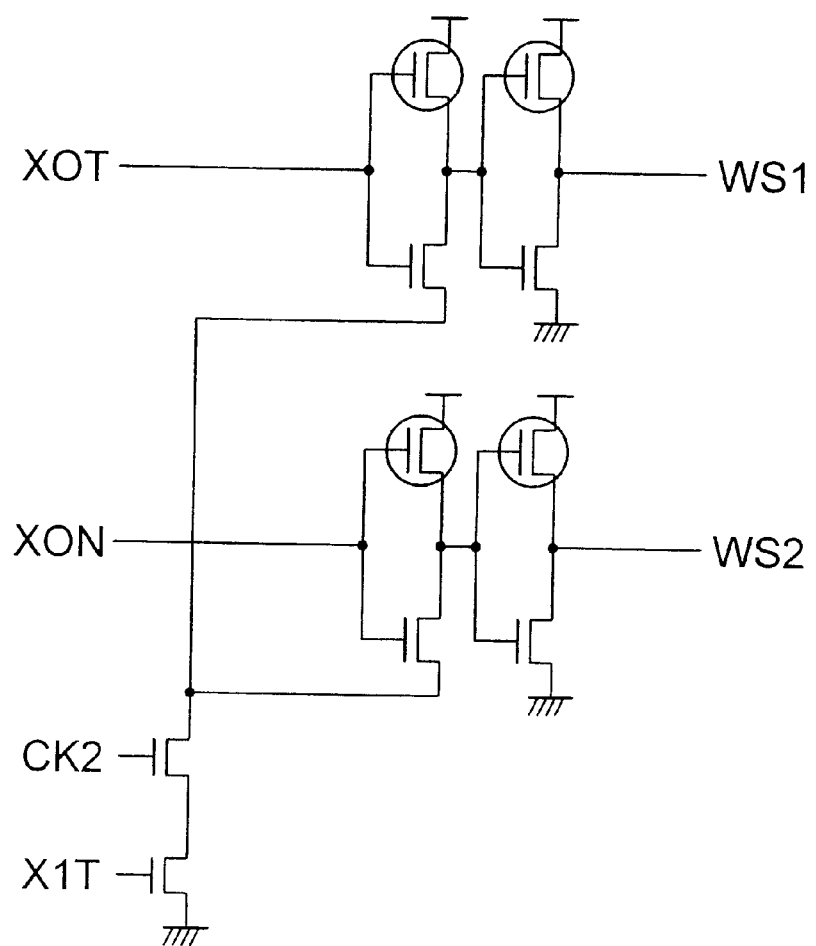
FIG. 8 is a circuit diagram of the word line activation block in the DRAM of the embodiment.

Referring to FIG. 8, the word line activation block, for example, word line activation block WA1 receives a complementary pair of signals XOT and XON to deliver the activation signals through activation signal lines WS1 and WS2, wherein signal XOT is high if the LSB of the row address signal is true or "1" whereas signal XON is high if the LSB of the row address signal is false or "0". Other activation signals on the activation signal lines WS5 and WS6, for examples, for the next memory cell blocks MCA2 have the same values as the signals on the activation signal lines WS1 and WS2, respectively, and thus the memory cell blocks MCA1 to MCA4, for example, in the same row are selected at once for outputting data at the same time.

Figure 9:
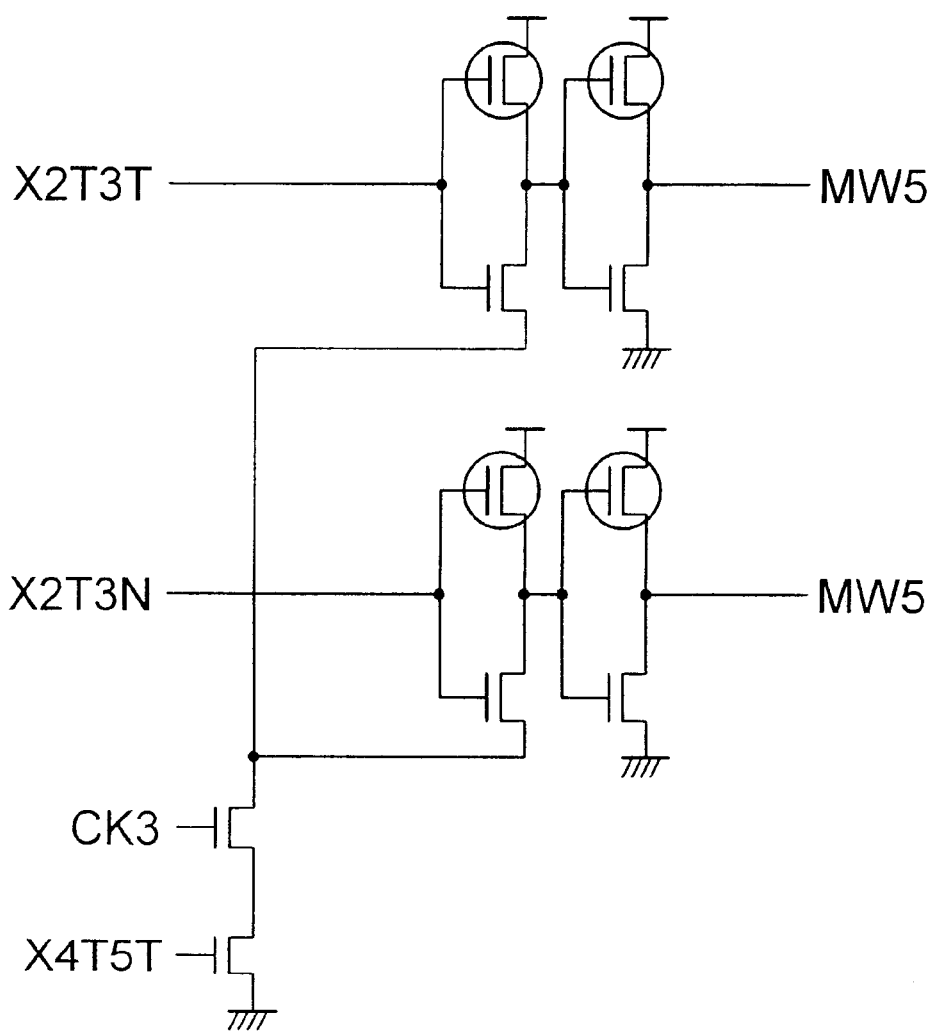
FIG. 9 is a circuit diagram of the column address decoder in the DRAM of the embodiment.

Referring to FIG. 9, one of the row address decoders XD1 to XD8, row address decoder XD3 for example, receives a complementary pair of signals X2T3T and X2T3N, and delivers the main word signals MW5 and MW6 which assume the same levels as the levels of the signals X2T3T and X2T3N, respectively, for activating one of the main word lines MW1 to MW16.

The four word line activation blocks WA1 to WA4 output the word line activation signals the activation signal lines WS1, WS2, WS3 and WS4, respectively, each of which extends between adjacent two of the main word lines MW5 to MW12 in parallel to the main word lines MW1 to MW16 and input to the subword driver sections SWD1, SW5 etc.

As for the metal interconnections disposed in the DRAM of the present embodiment, the word line activation signal lines WS1 to WS4 have first portions extending in the row direction and implemented by a first-level aluminum layer, which also implements the main word lines MW1 to MW8. The first portions of the word line activation signal lines WS1 to WS4 are connected to second portions thereof extending in the column direction, through via holes formed in the area for the subword driver sections SW1, SW5 etc. The second portions are implemented by a second-level aluminum layer.

In this way, the arrangement of the word line activation blocks WA1 to WA4 disposed inside the row address decoders XD3 to XD6 provides a wider design choice for the arrangement of the peripheral circuit blocks disposed adjacent to the column decoder blocks YDA1 to YDA4.

Figure 10:
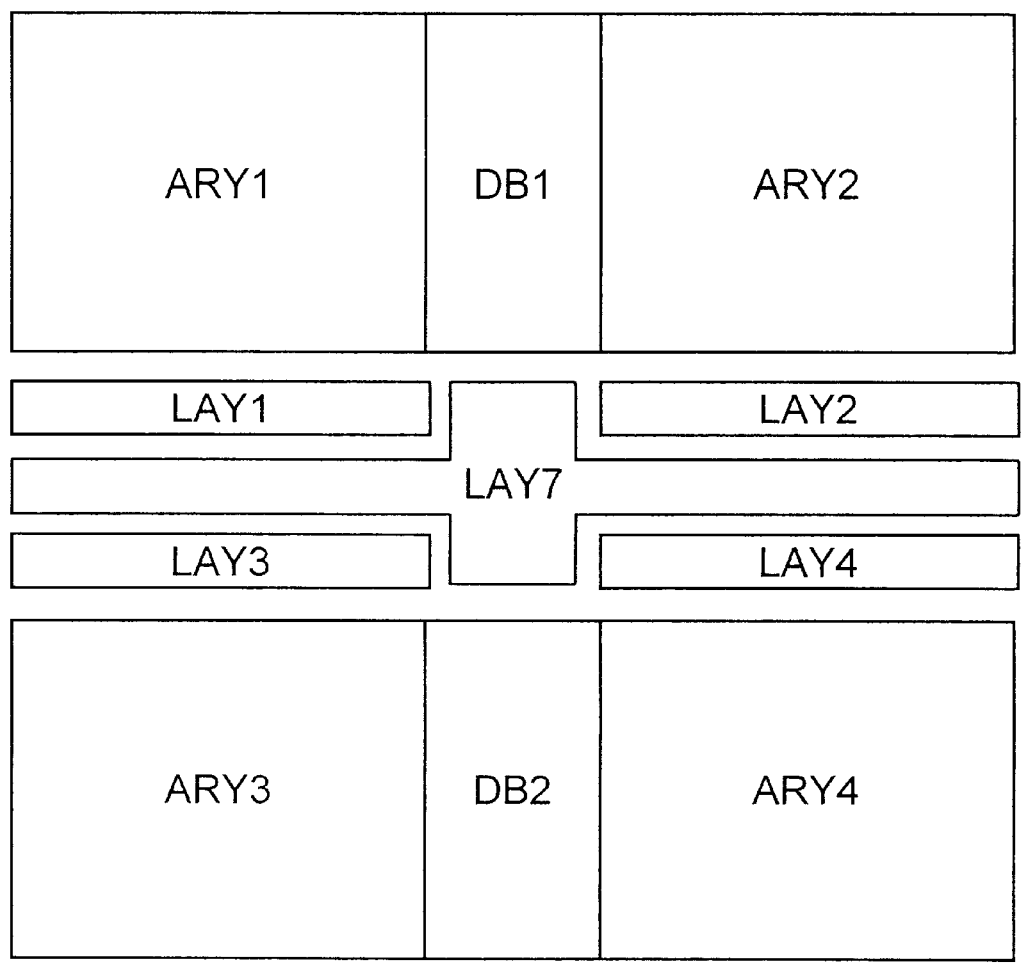
FIG. 10 is a top plan view of a virtual channel DRAM as another embodiment of the present invention.

Referring to FIG. 10, a virtual channel DRAM formed as a semiconductor memory device according to another embodiment of the present invention includes a data buffer areas DB1 and DB2 adjacent to the column decoder blocks. The arrangement of the word line activation blocks within the row address decoder does not cause the problem for the arrangement of the data buffer area.

In the above embodiment, the memory cells disposed in the memory cell blocks arranged in a row are selected at once for delivery of the data toward outside the memory device at a time.

The word line activation blocks are arranged in the exemplified row address decoders; however, the word line activation blocks can be disposed within any of the row address decoder blocks or in the vicinity thereof.

In addition, the number of the memory cell arrays or memory cell blocks are mere example in the above embodiments, and thus the numbers of the memory cell arrays and the memory cell blocks can be selected as desired. The semiconductor memory device may have a single memory cell array.

It will be obvious that the present invention is not limited to the embodiments described above, and various modifications may be made to the embodiments without departing from the scope of the present invention.

What is claimed is:

1. A semiconductor memory device comprising:
    a memory cell array including an array of memory cell blocks arranged in a matrix, each of said memory cell blocks including a plurality of memory cells arranged in a matrix, a plurality of subword lines each for specifying a row of said memory cells, and a plurality of data lines for specifying a column of said memory cells;
    a column address decoder block including a plurality of column address decoders each responding to a column address signal to specify a corresponding one of said data lines;
    a row address decoder block including a plurality of row address decoders each for responding to significant bits of a row address signal to generate a main word signal;
    a plurality of main word lines disposed corresponding to said address decoders for transferring said main word signal;
    a plurality of word line activation blocks including a plurality of word line activation decoders each for responding to a less-significant bit of said row address signal to generate a subword signal;
    a plurality of word line activation lines each disposed for a corresponding one of said word line activation decoders to transfer said subword signal; and
    a subword driver block for responding to said main word signal and said subword signal to specify one of said subword lines,
    wherein at least some of said word line activation blocks are disposed within the area of at least some of said row address decoder blocks.

2. The semiconductor memory device as defined in claim 1, wherein each of said word line activation lines has a first portion extending parallel to said main word lines.

3. The semiconductor memory device as defined in claim 2, wherein each of said word line activation lines has a second portion extending normal to said first portion.

4. The semiconductor memory device as defined in claim 3, wherein said first portion is connected to said second portion through a via hole disposed within an area for said subword driver block.

5. The semiconductor memory device as defined in claim 1, wherein each of said word line activation decoders generates said subword signal after one of said main address decoders generates said main word signal.

6. The semiconductor memory device as defined in claim 1, wherein a number of said word line activation decoders is half a number of said row address decoders.

7. The semiconductor memory device as defined in claim 1, wherein said word line activation block has a function of determining a timing of applying a voltage to one of said subword lines.

8. The semiconductor memory device as defined in claim 1, wherein said memory cell array is divided into a plurality of memory cell array sections each including said plurality of memory cell blocks, and said subword driver block is divided into a plurality of subword driver block sections.

9. A semiconductor memory device comprising:
    a memory cell array including an array of memory cell blocks arranged in a matrix, each of said memory cell blocks including a plurality of memory cells arranged in a matrix, a plurality of subword lines each for specifying a row of said memory cells, and a plurality of data lines for specifying a column of said memory cells;
    a column address decoder block including a plurality of column address decoders each responding to a column address signal to specify a corresponding one of said data lines;
    a row address decoder block including a plurality of row address decoders each for responding to significant bits of a row address signal to generate a main word signal;
    a plurality of main word lines disposed corresponding to said address decoders for transferring said main word signal;
    a word line activation block including a plurality of word line activation decoders each for responding to a less-significant bit of said row address signal to generate a subword signal;
    a plurality of word line activation lines each disposed for a corresponding one of said word line activation decoders to transfer said subword signal; and
    a subword driver block for responding to said main word signal and said subword signal to specify one of said subword lines,
    wherein said word line activation block is disposed immediately adjacent to at least some of said row address decoders,
    each of said word line activation lines has a first portion extending parallel to said main word lines and
    a second portion extending normal to said first portion,
    wherein said first portion is connected to said second portion through a via hole disposed within an area for said subword driver block.

10. The semiconductor memory device as defined in claim 9, wherein each of said word line activation decoders generates said subword signal after one of said main address decoders generates said main word signal.

11. The semiconductor memory device as defined in claim 9, wherein a number of said word line activation decoders is half a number of said row address decoders.

12. The semiconductor memory device as defined in claim 9, wherein said word line activation block has a function of determining a timing of applying a voltage to one of said subword lines.

13. The semiconductor memory device as defined in claim 9, wherein said memory cell array is divided into a plurality of memory cell array sections each including said plurality of memory cell blocks, and said subword driver block is divided into a plurality of subword driver block sections.

* * * * *